(12) United States Patent
Dunga et al.

(10) Patent No.: US 10,971,240 B1
(45) Date of Patent: Apr. 6, 2021

(54) WORDLINE SMART TRACKING VERIFY

(71) Applicant: SanDisk Technologies LLC, Addison, TX (US)

(72) Inventors: Mohan Dunga, Santa Clara, CA (US); Pitamber Shukla, Santa Clara, CA (US)

(73) Assignee: SanDisk Technologies LLC

( * ) Notice: Subject to any disclaimer, the term of this patent is extended or adjusted under 35 U.S.C. 154(b) by 0 days.

(21) Appl. No.: 16/726,387

(22) Filed: Dec. 24, 2019

(51) Int. Cl.
| | |
|---|---|
| *G11C 16/04* | (2006.01) |
| *G11C 16/34* | (2006.01) |
| *G11C 16/08* | (2006.01) |
| *G11C 16/16* | (2006.01) |
| *G11C 16/12* | (2006.01) |

(52) U.S. Cl.
CPC ............ *G11C 16/344* (2013.01); *G11C 16/08* (2013.01); *G11C 16/12* (2013.01); *G11C 16/16* (2013.01)

(58) Field of Classification Search
CPC ....... G11C 16/344; G11C 16/08; G11C 16/12; G11C 16/16
See application file for complete search history.

(56) References Cited

U.S. PATENT DOCUMENTS

| | | | | |
|---|---|---|---|---|
| 7,243,185 B2 * | 7/2007 | See | ...................... | G06F 12/0804 365/185.33 |
| 7,688,612 B2 * | 3/2010 | Lee | .................... | G11C 16/0475 365/63 |
| 10,658,040 B2 * | 5/2020 | Lim | ........................ | G11C 16/26 |

\* cited by examiner

*Primary Examiner* — Pho M Luu
(74) *Attorney, Agent, or Firm* — Dickinson Wright PLLC; Steven Hurles

(57) ABSTRACT

The storage device comprises a non-volatile memory coupled to a controller. The controller is configured to determine a first programming voltage by performing at least one program-verify iteration on a first word line using a voltage value which starts as a predetermined first initial voltage and is sequentially increased by a first voltage step amount following each failure to successfully program until the programming is completed. The controller is also configured to determine a second initial programming voltage by decreasing the first programming voltage by a second voltage step amount. The controller is further configured to perform at least one program-verify iteration on a second word line of the plurality of word lines using a voltage value which starts as the second initial programming voltage and is increased by the first voltage step amount following each sequential failure to successfully program until the programming is completed.

20 Claims, 21 Drawing Sheets

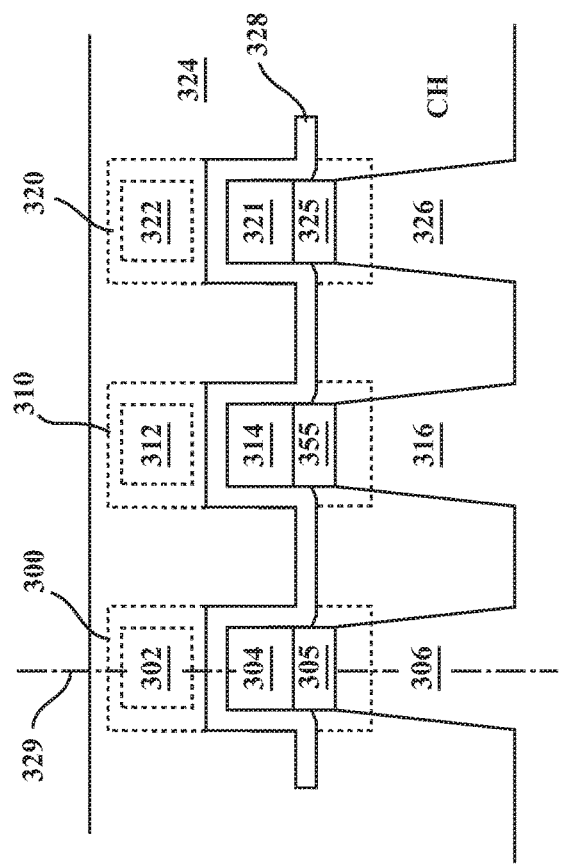
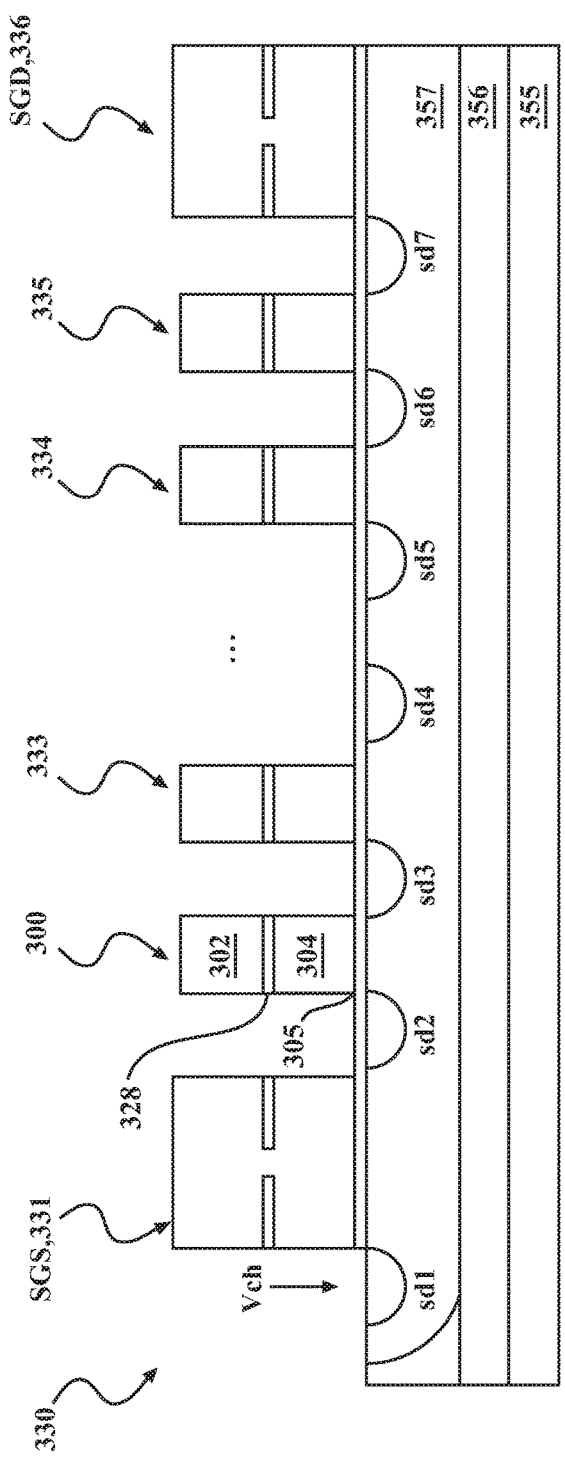

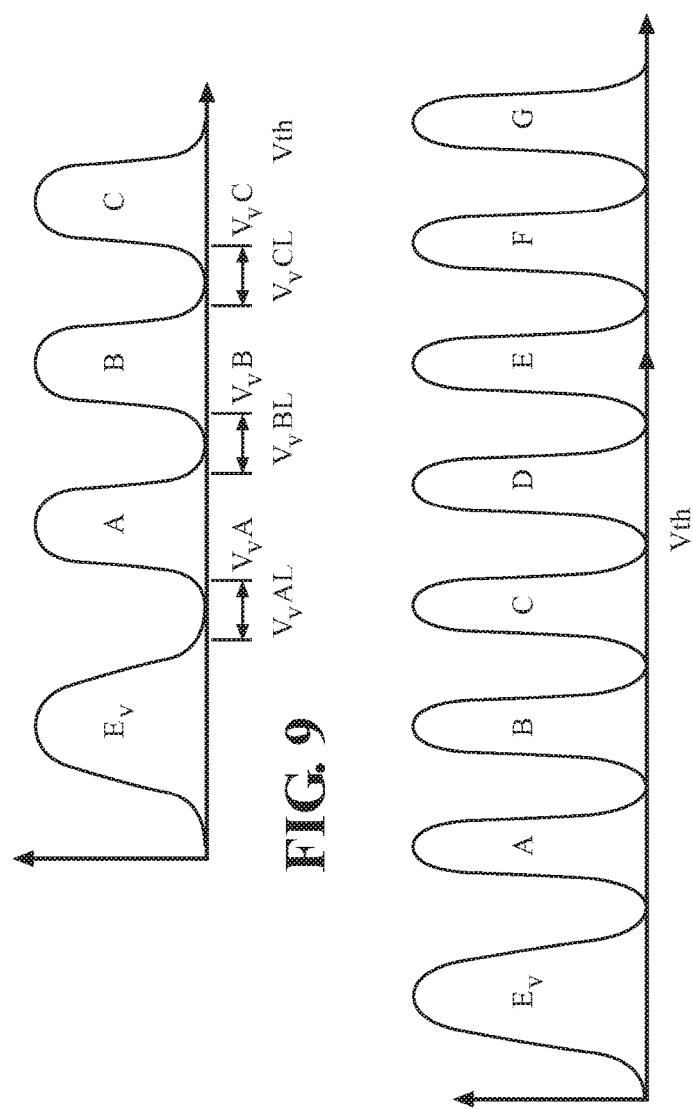
FIG. 9
FIG. 10
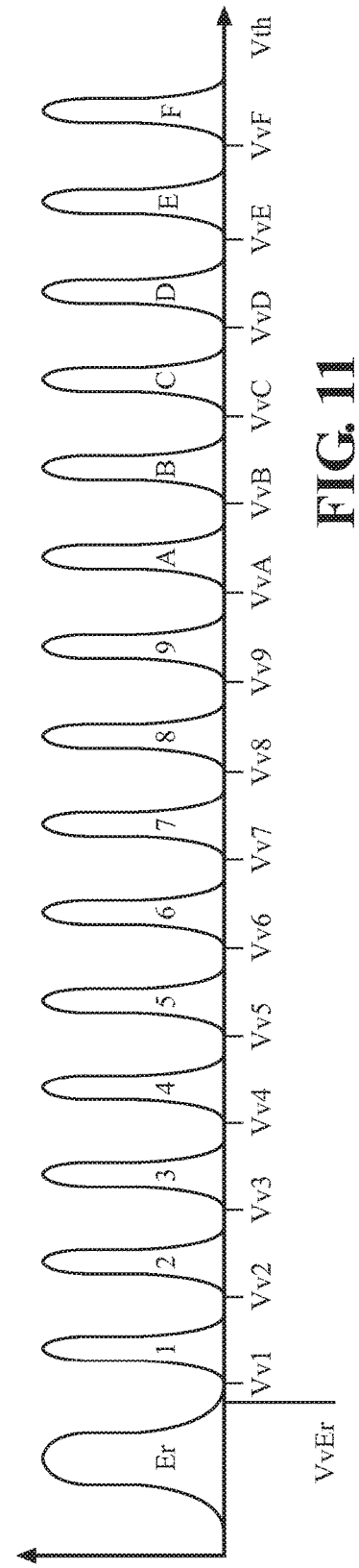
FIG. 11

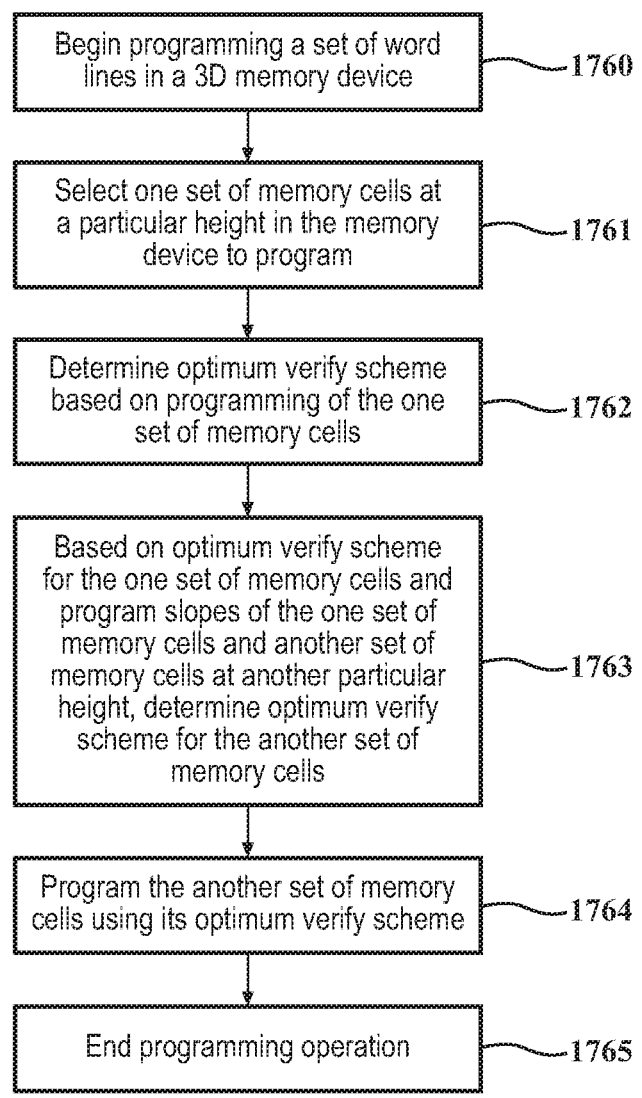

WORDLINE SMART TRACKING VERIFY

BACKGROUND

The present technology relates to the operation of memory devices.

Semiconductor memory devices are widely used in various electronic devices such as laptops, digital audio players, digital cameras, cellular phones, video game consoles, scientific instruments, industrial robots, medical electronics, solid state drives, automotive electronics, Internet of Things (IOT) devices and universal serial bus (USB) devices. Semiconductor memory includes both non-volatile and volatile memory. Non-volatile memory retains stored information without requiring an external power source. Examples of non-volatile memory include flash memory (e.g., NAND-type and NOR-type flash memory) and Electrically Erasable Programmable Read-Only Memory (EEPROM).

A memory device can be coupled to one or more hosts, where one or more interfaces are used to access the memory device. Additionally, the memory device is often managed by a controller, where among several roles, the controller is configured to interface between the host and the memory device.

SUMMARY

One aspect of the present invention is related to a storage device which includes a non-volatile memory that is coupled to a controller. The non-volatile memory includes control circuits and a memory array. The memory array includes a plurality of word lines. The controller is configured to determine a first programming voltage by performing at least one program-verify iteration on at least a portion of a first word line of the plurality of word lines using a voltage value which starts as a predetermined first initial voltage and is sequentially increased by a first voltage step amount following each failure to successfully program until the programming is completed. The controller is also configured to determine a second initial programming voltage by decreasing the first programming voltage by a second voltage step amount. The controller is further configured to perform at least one program-verify iteration on at least a portion of a second word line of the plurality of word lines using a voltage value which starts as the second initial programming voltage and is increased by the first voltage step amount following each sequential failure to successfully program until the programming is completed.

Another aspect of the present invention is related to a method of reducing a time to perform smart verify in a storage device that includes a controller and a memory array. The method includes the step of programming at least one program-verify iteration on at least a portion of a first word line of the memory array using a voltage value which starts as a predetermined initial value and is sequentially increased by a first voltage step amount following each failure to successfully program until the programming is completed to determine a first programming voltage. The method continues with the step of determining a second initial programming voltage by decreasing the first programming voltage by a second voltage step amount. The method proceeds with the step of performing at least one program-verify iteration on at least a portion of a second word line of the memory array using a voltage value which starts as the second initial programming voltage and is increased by the first voltage step amount following each sequential failure to successfully program until the programming is completed.

Yet another aspect of the present invention is related to an apparatus which includes a plurality of memory cells arranged in a plurality of pages. A control circuit is coupled to the plurality of memory cells and is configured to acquire a first programming voltage by performing at least one program-verify iteration on at least a portion of a first page until the at least a portion of the first page is programmed. The control circuit is also configured to program at least a portion of a second page using the first programming voltage. The control circuit is further configured to perform at least one program-verify iteration on at least a portion of a third page and wherein the at least one program-verify iteration starts with a voltage value which is less than the first programming voltage until the at least a portion of the third page is programmed.

BRIEF DESCRIPTION OF THE DRAWINGS

For a detailed description of example embodiments, reference will now be made to the accompanying drawings in which:

FIG. 3A depicts a cross-sectional view of example floating gate memory cells in NAND strings;

FIG. 3B depicts a cross-sectional view of the structure of FIG. 3A along line 329;

FIG. 9 depicts the Vth distributions of memory cells in an example one-pass programming operation with four data states.

FIG. 10 depicts the Vth distributions of memory cells in an example one-pass programming operation with eight data states.

FIG. 11 depicts the Vth distributions of memory cells in an example one-pass programming operation with sixteen data states.

FIG. 17 is a flowchart of an example programming operation which determines an optimum verify scheme for one set of memory cells and applies the optimum verify scheme to another set of memory cells, where the sets are at different heights in a 3D memory device.

DETAILED DESCRIPTION

Figure 1B:
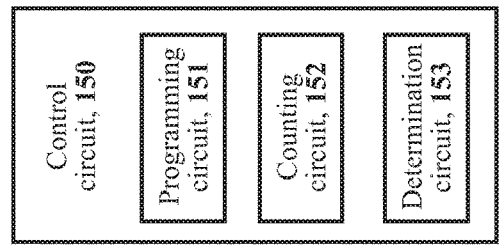
FIG. 1B is a block diagram of an example control circuit which comprises a programming circuit, a counting circuit, and a determination circuit.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

As described herein, methods are described for reading a memory using bi-directional sensing, including: programming first memory cells coupled to a first word-line using a normal programming order; programming second memory cells coupled to a second word-line using a normal programming order; reading data from the first memory cells by applying a normal sensing operation to the first word-line; and reading data from the second memory cells by applying a reverse sensing operation to the second word-line.

In some embodiments, bi-directional sensing includes a smart sensing operation used in scenarios where a neighboring word-line interference impacts a read operation. In additional embodiments, a memory cell is read using bi-directional sensing based on a location of the word-line coupled to the memory cell. For example, a word-line disposed along the edge of the memory may be read using a normal sensing operation while a word-line disposed in the middle of the memory may be read using a reverse sensing operation.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 9). In a three-bit per cell memory device, there are eight data states including the erased state and seven higher data states referred to as the A, B, C, D, E, F and G data states (see FIG. 10). In a four-bit per cell memory device, there are sixteen data states including the erased state and fifteen higher data states referred to as the Er, 1, 2, 3, 4, 5, 6, 7, 8, 9, A, B, C, D, E and F data states (see FIG. 11).

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and can be lower than the final verify voltage. When a memory cell is close to completion of programming, the programming speed of the memory cell can be reduced such as by elevating a voltage of a respective bit line during one or more subsequent program voltages. For example, in FIG. 9, a memory cell which is to be programmed to the A data state can be subject to verify tests at VvAL, an offset verify voltage of the A data state, and VvA, a final verify voltage of the A data state. By slowing the programming speed just before a memory cell completes programming, narrower Vth distributions can be achieved.

However, time is consumed in performing the verify tests. For example, typically, a verify test involves applying a verification signal to the control gates of the selected memory cells via a selected word line, pre-charging sense circuits which are connected to the selected memory cells via respective bit lines and observing an amount of discharge in the sense circuits for a specified discharge period. Moreover, this is repeated for each verify voltage of the verification signal. Moreover, the time consumed will increase as the number of data states increases, such as with a 16 state memory device having a Vth distribution such as in FIG. 11.

A verify scheme can be defined in which the number of verify tests is optimized, e.g., by avoiding unnecessary verify tests. The verify test for a data state should be skipped until the upper tail of the Vth distribution approaches the verify voltage of the state. One approach is to specify based on empirical data, which verify tests are to be performed in which program-verify iterations. This approach may be satisfactory when there are a small number of data states and program-verify iterations. However, this approach become less efficient when there are a large number of data states and program-verify iterations.

Techniques provided herein adaptively determine when to begin verify tests for a particular data state based on a programming progress of a set of memory cells. In one approach, a count is made in a program-verify iteration of memory cells which pass a verify test of a state N. The count is used to determine a subsequent program-verify iteration in which to perform a verify test of a higher state, N+k, where k is a positive integer, e.g., 1, 2, . . . . Moreover, the subsequent program-verify iteration can be determined adaptively as a function of an amount by which the count exceeds a threshold count. If the amount is relatively small, the Vth distribution of the memory cells assigned to the N+k state is relatively far from the verify voltage of the N+k state, so that a number of program-verify iterations to skip before the subsequent program-verify iteration is relatively large. If the amount is relatively large, the Vth distribution of the memory cells assigned to the N+k state is relatively close to the verify voltage of the N+k state, so that a number of program-verify iterations to skip before the subsequent program-verify iteration is relatively small.

The value of k can be set based on factors such as the program pulse step size and the program slope, which is the increase in Vth for a given increase in the program voltage (Vpgm). k should be relatively large when the step size and program slope is relatively large. In this case, the Vth distribution can increase a relatively large amount with each program voltage, so the program-verify iteration in which the count is made should be relatively far below the subsequent program-verify iteration. An example is k=1, 2 or 3.

In another approach, an optimum verify scheme is implemented on a per-group basis for groups of adjacent memory cells at different heights in a stack of a 3D memory device. In another approach, an optimum verify scheme is implemented on a per-layer basis for sets of memory cells at a common height or word line layer in a stack of a 3D memory device.

Various other features and benefits are described below.

Figure 1A:
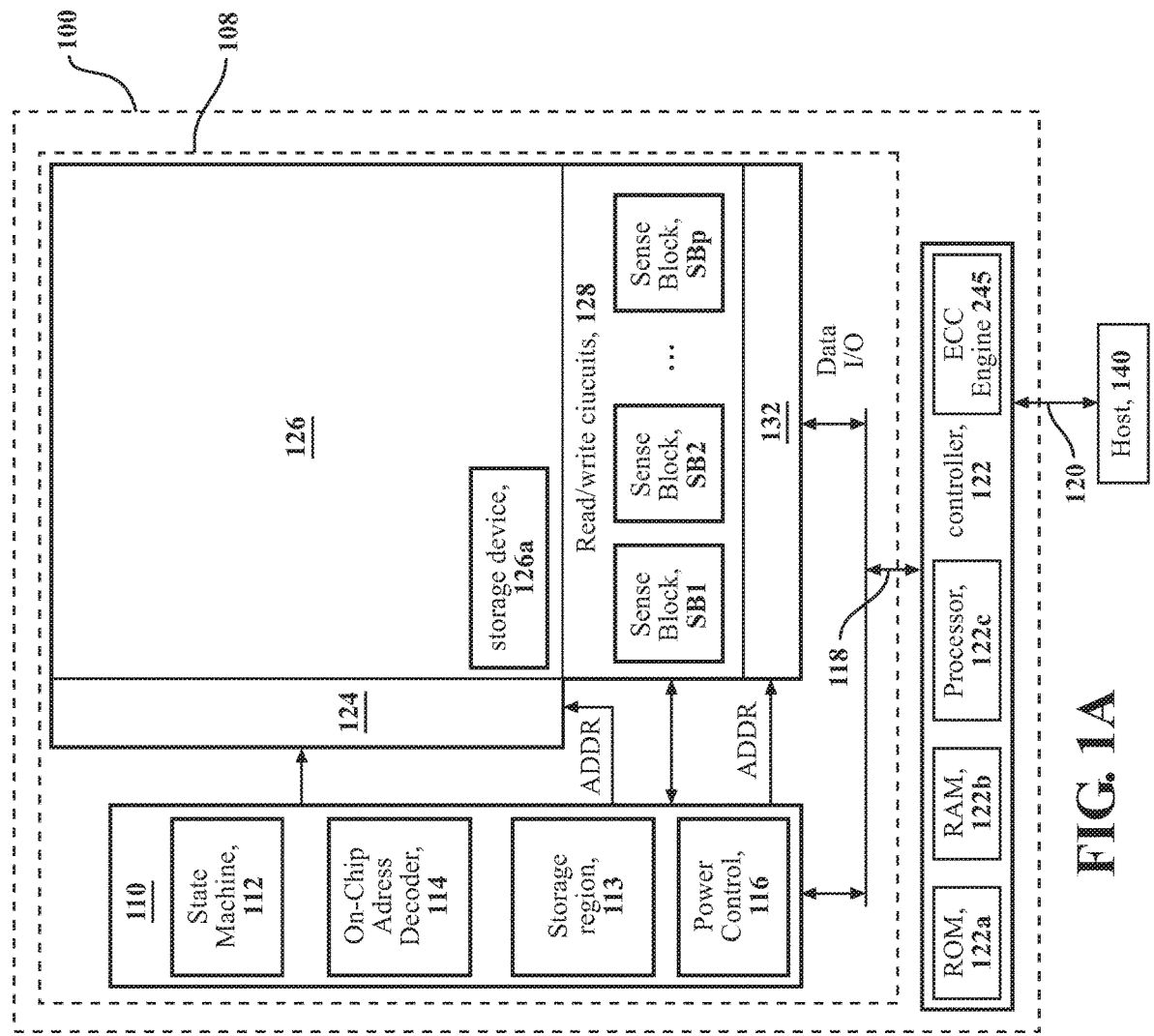
FIG. 1A is a block diagram of an example memory device.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein: the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

For example, FIG. 1B is a block diagram of an example control circuit 150 which comprises a programming circuit 151, a counting circuit 152 and a determination circuit 153. The programming circuit may include software, firmware and/or hardware which implements, e.g., steps 1200-1220 of FIG. 12 and/or steps 1300-1324 of FIG. 13. The counting circuit may include software, firmware and/or hardware which implements, e.g., steps 1425 and 1432 of FIG. 14. The determination circuit may include software, firmware and/or hardware which implements, e.g., step 1427 of FIG. 14.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
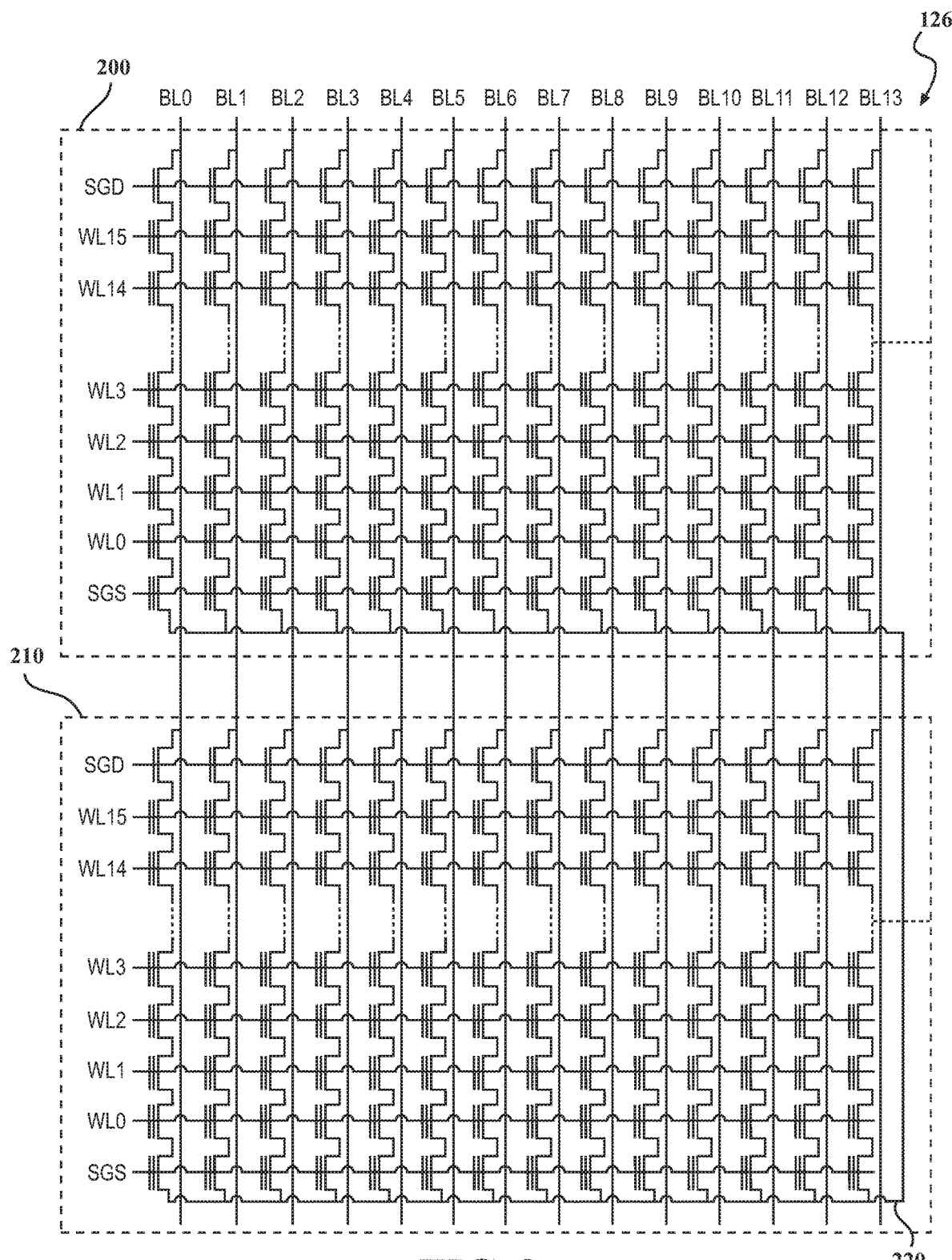
FIG. 2 depicts blocks of memory cells in an example two-dimensional configuration of the memory array of FIG. 1.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
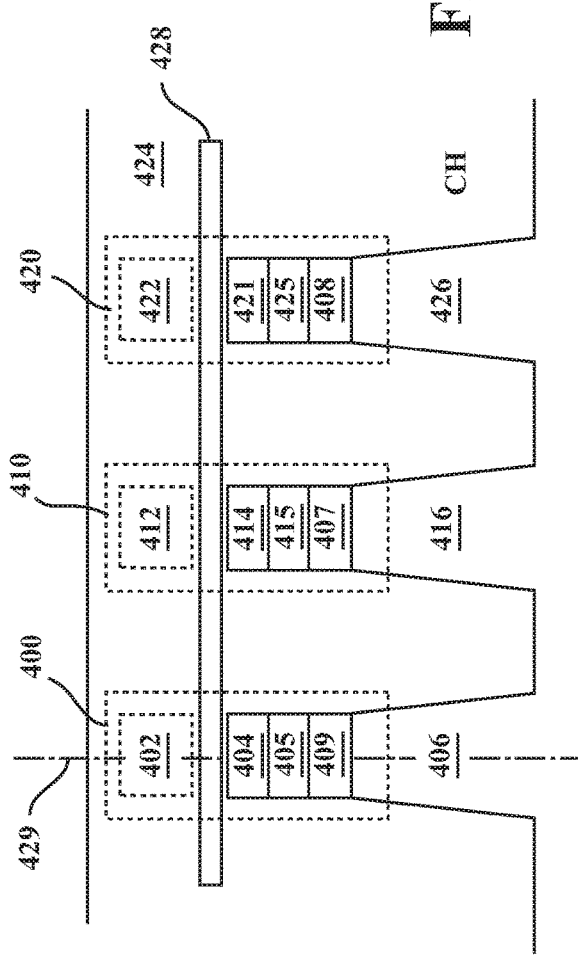
FIG. 4A depicts a cross-sectional view of example charge-trapping memory cells in NAND strings.
Figure 4B:
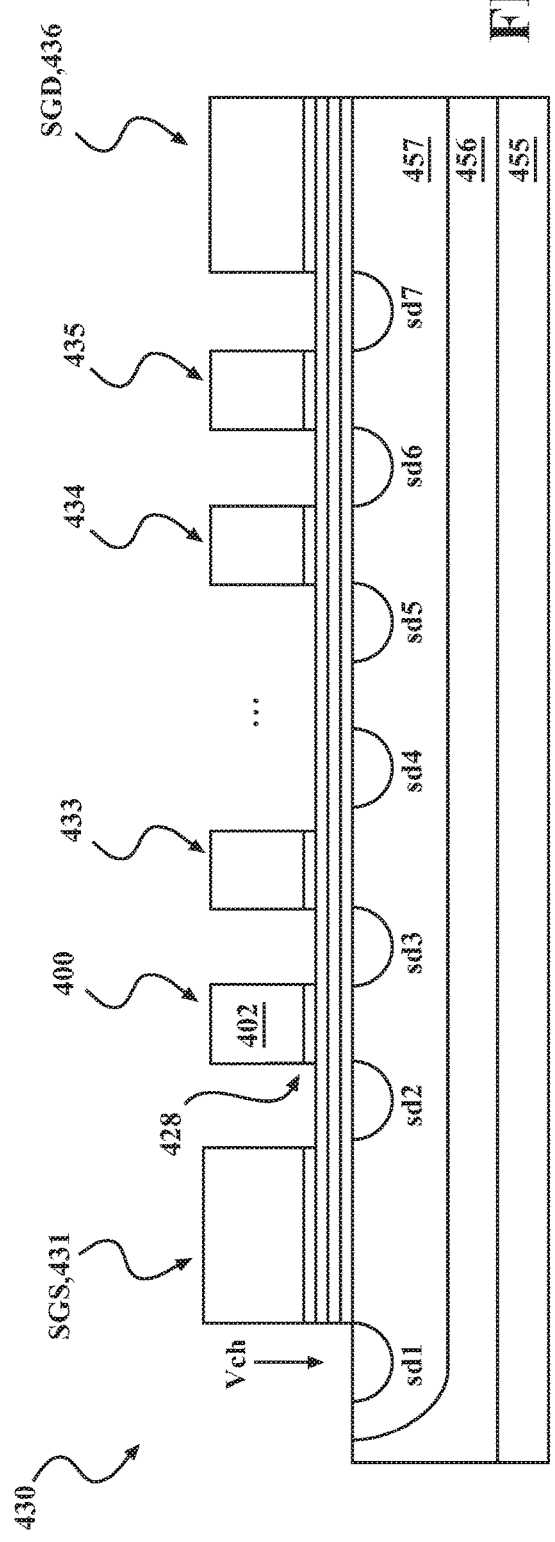
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N-O-N-O-N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
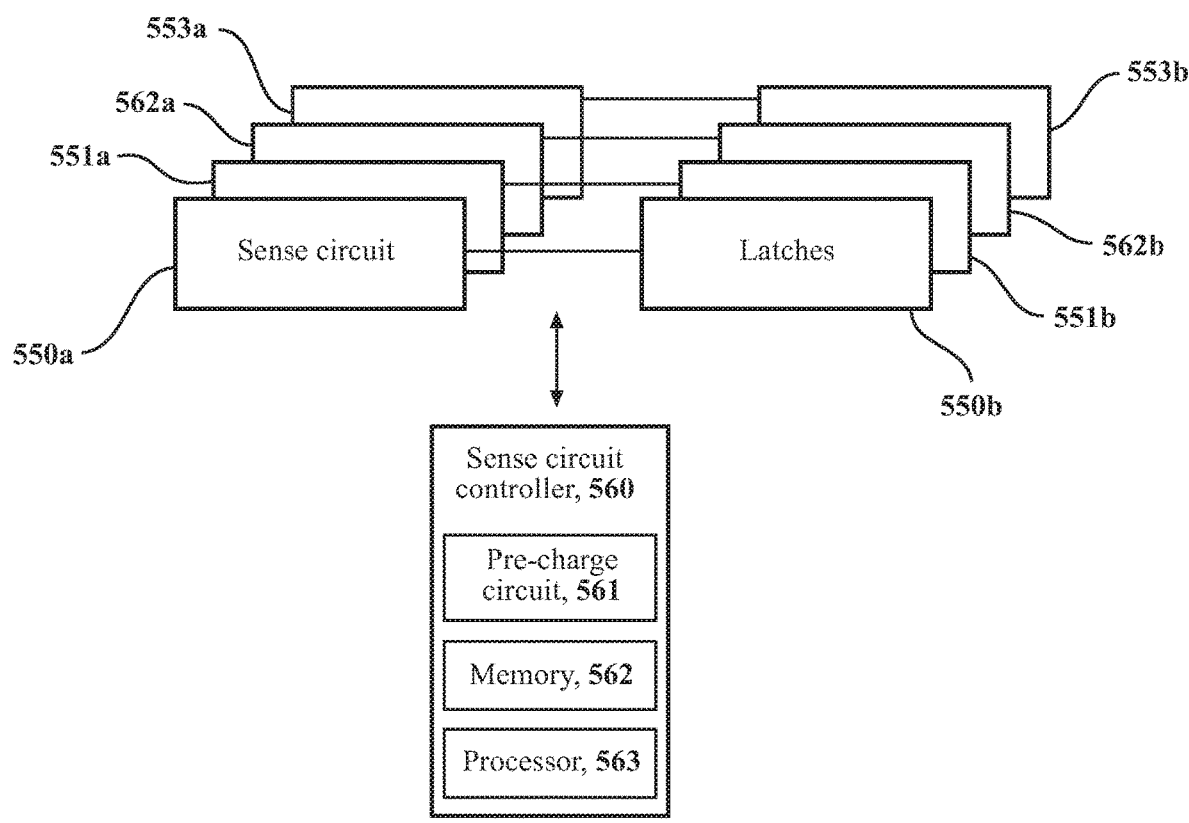
FIG. 5A depicts an example block diagram of the sense block SB1 of FIG. 1.

FIG. 5A depicts an example block diagram of the sense block SB1 of FIG. 1. In one approach, a sense block comprises multiple sense circuits. Each sense circuit is associated with data latches. For example, the example sense circuits 550*a*, 551*a*, 552*a* and 553*a* are associated with the data latches 550*b*, 551*b*, 552*b* and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
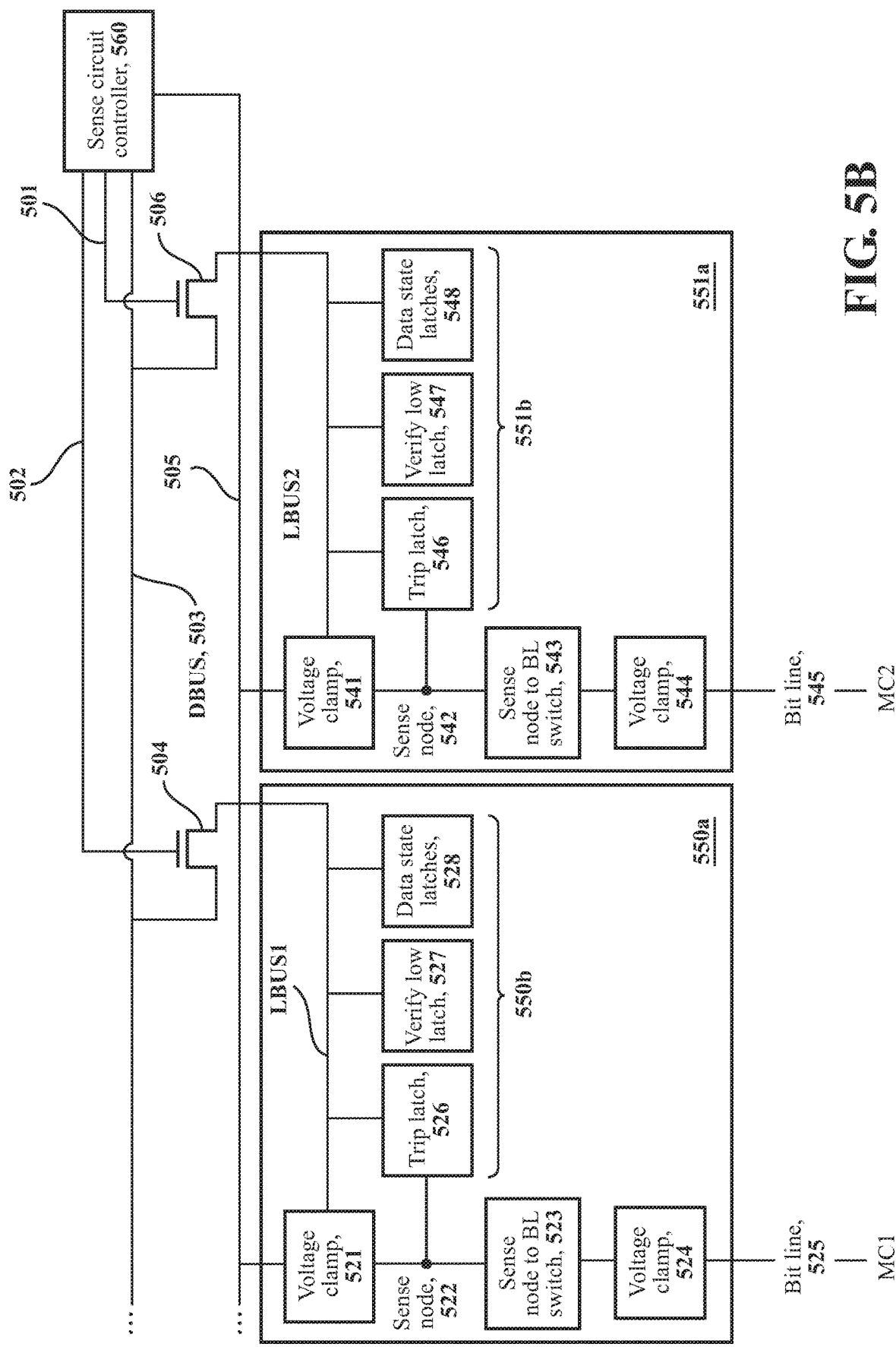
FIG. 5B depicts another example block diagram of the sense block SB1 of FIG. 1.

FIG. 5B depicts another example block diagram of the sense block SB1 of FIG. 1. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
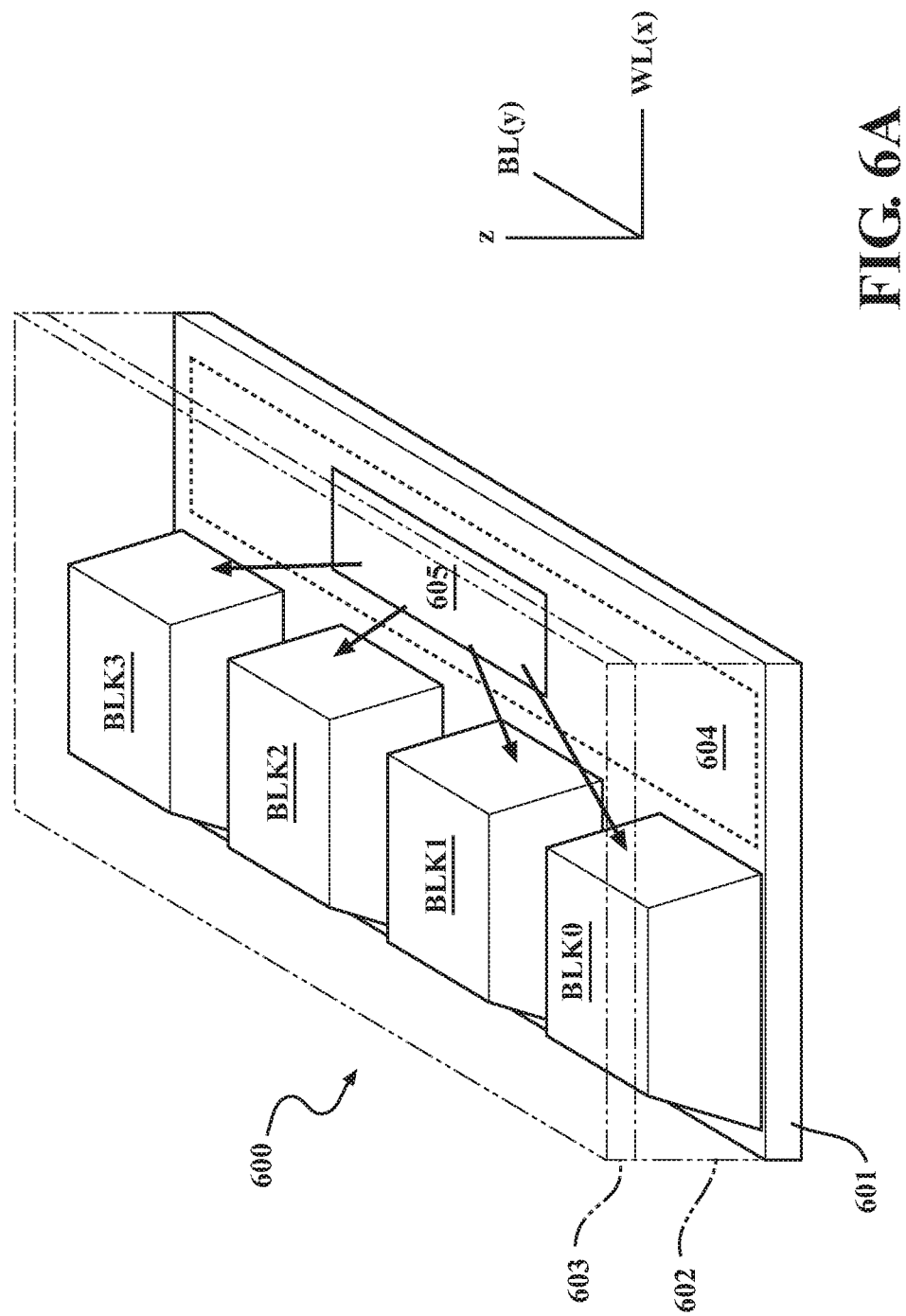
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
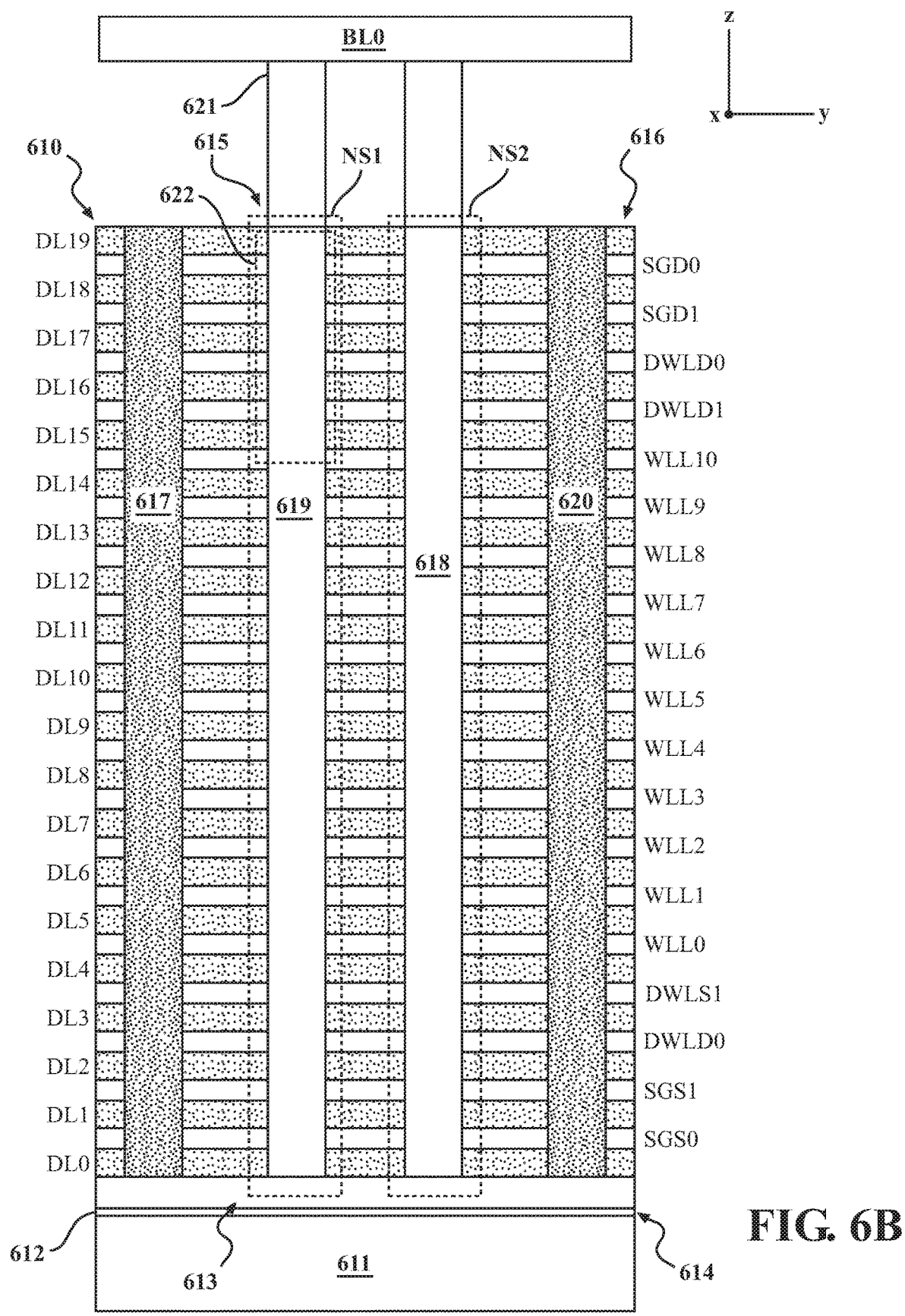
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
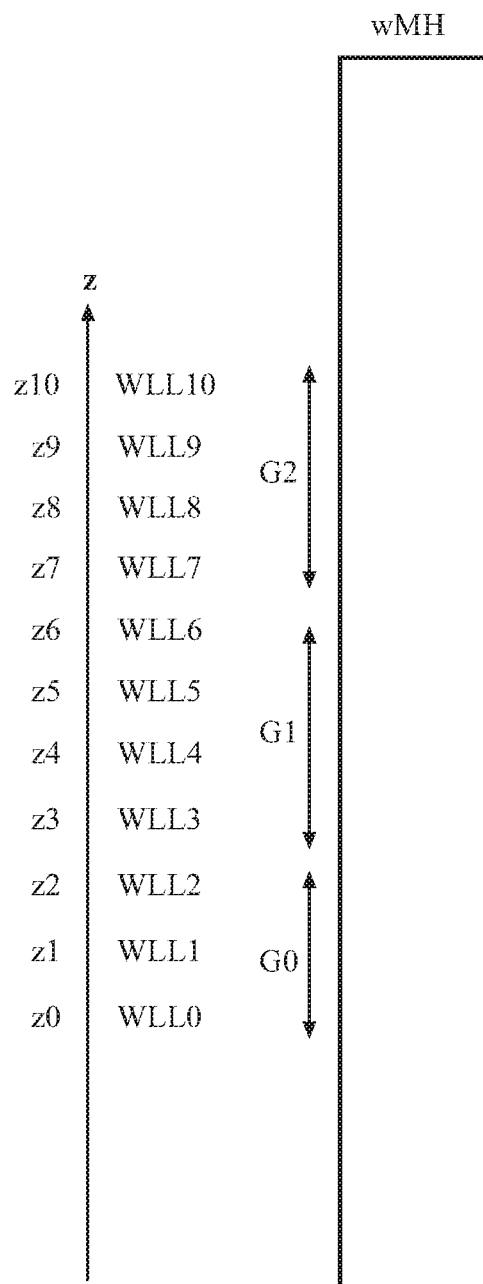
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
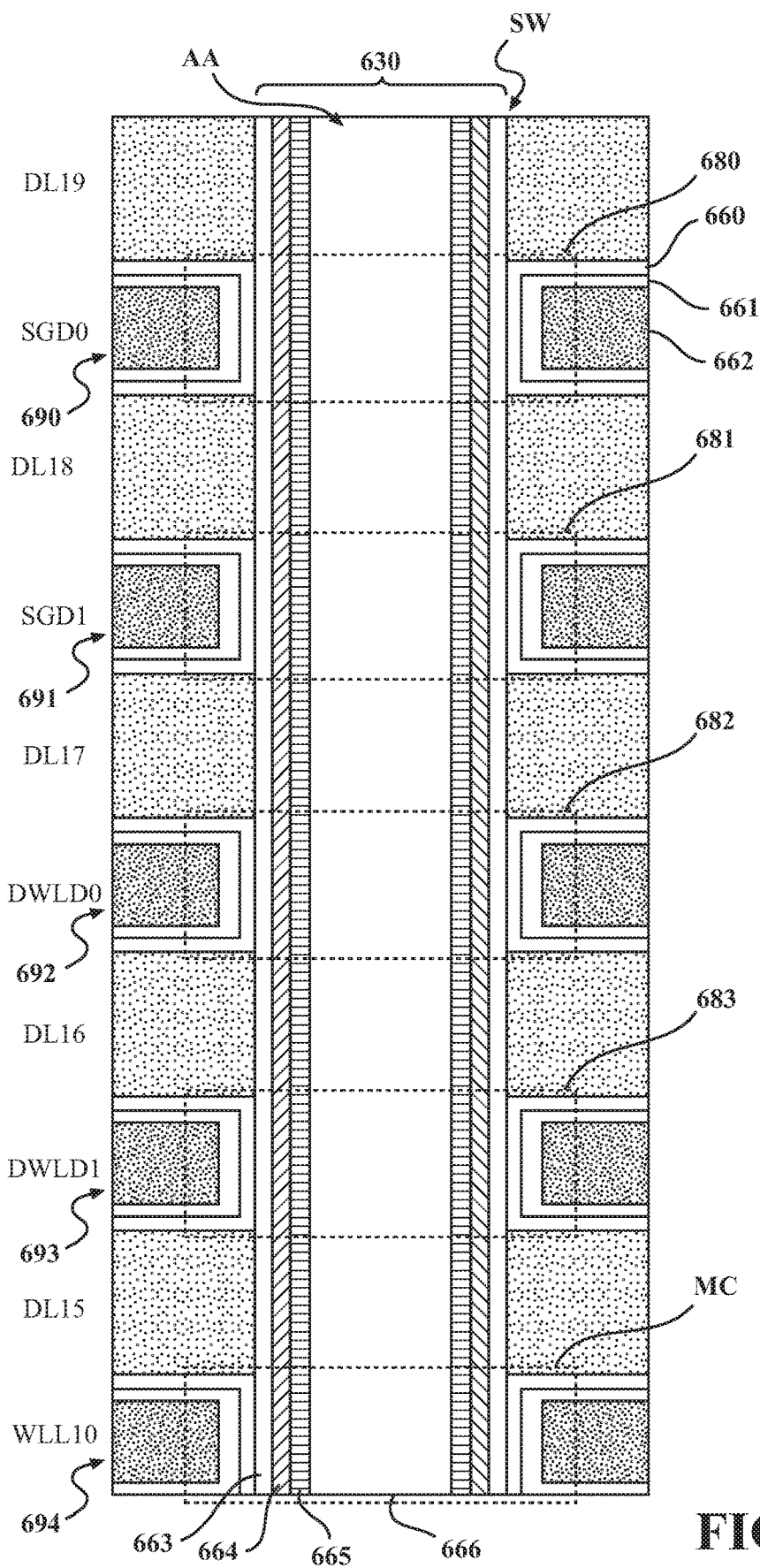
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
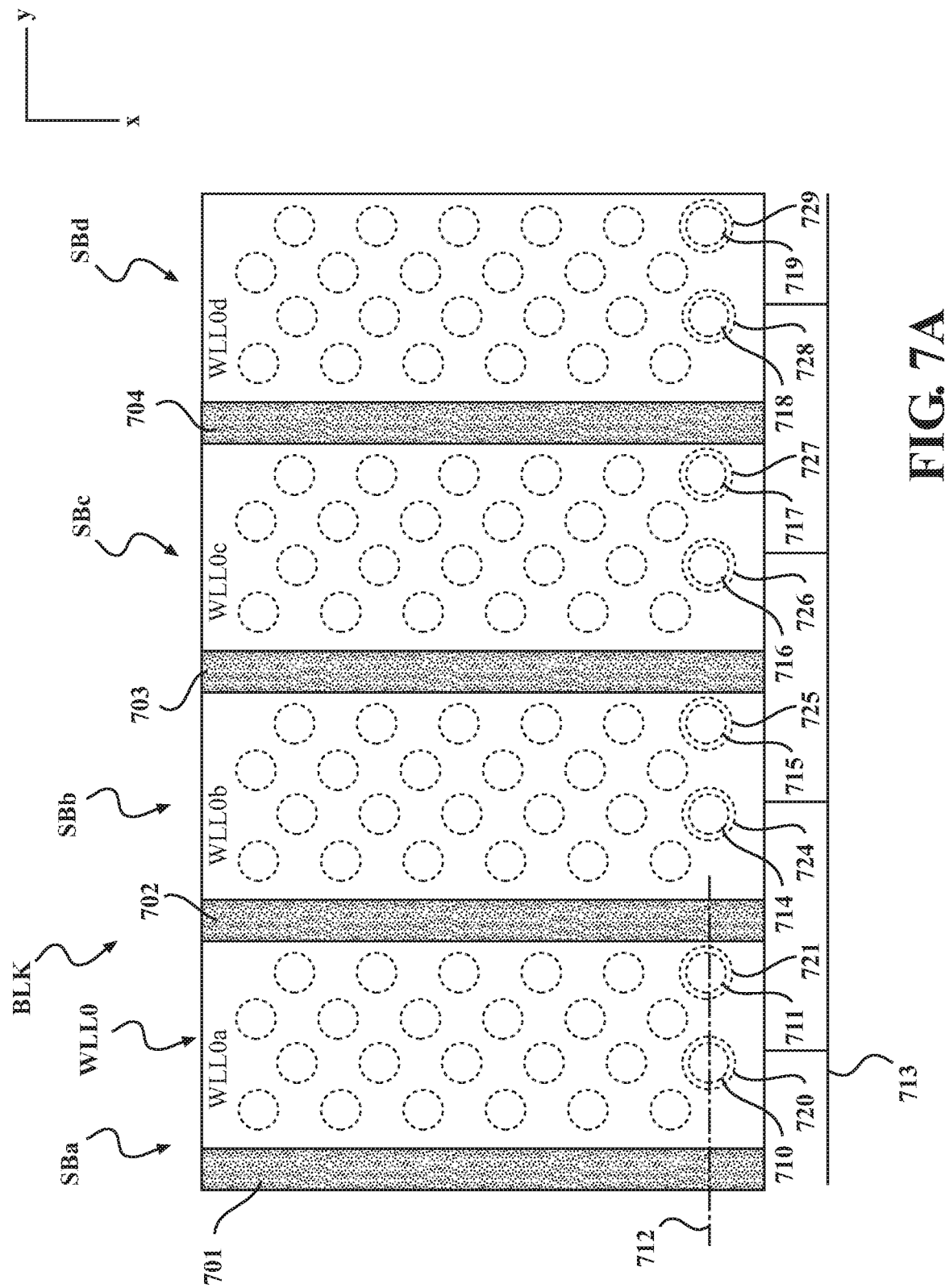
FIG. 7A depicts a top view of an example word line layer WLL0 of the stack of FIG. 6B.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

Figure 7B:
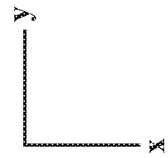
FIG. 7B depicts a top view of an example top dielectric layer DL19 of the stack of FIG. 6B.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0 d which are each connected by a connector 713. The last region of a word line layer in a block can be connected to a first region of a word line layer in a next block, in one approach. The connector, in turn, is connected to a voltage driver for the word line layer. The region WLL0 a has example memory holes 710 and 711 along a line 712. The region WLL0 b has example memory holes 714 and 715. The region WLL0 c has example memory holes 716 and 717. The region WLL0 d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 a, memory cells 724 and 725 are in WLL0 b, memory cells 726 and 727 are in WLL0 c, and memory cells 728 and 729 are in WLL0 d. These memory cells are at a common height in the stack.

Metal-filled slits 701, 702, 703 and 704 (e.g., metal interconnects) may be located between and adjacent to the edges of the regions WLL0 a-WLL0 d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 a, DL19 b, DL19 c and DL19 d. Each region can be connected to a respective voltage driver.

This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19 a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the –x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
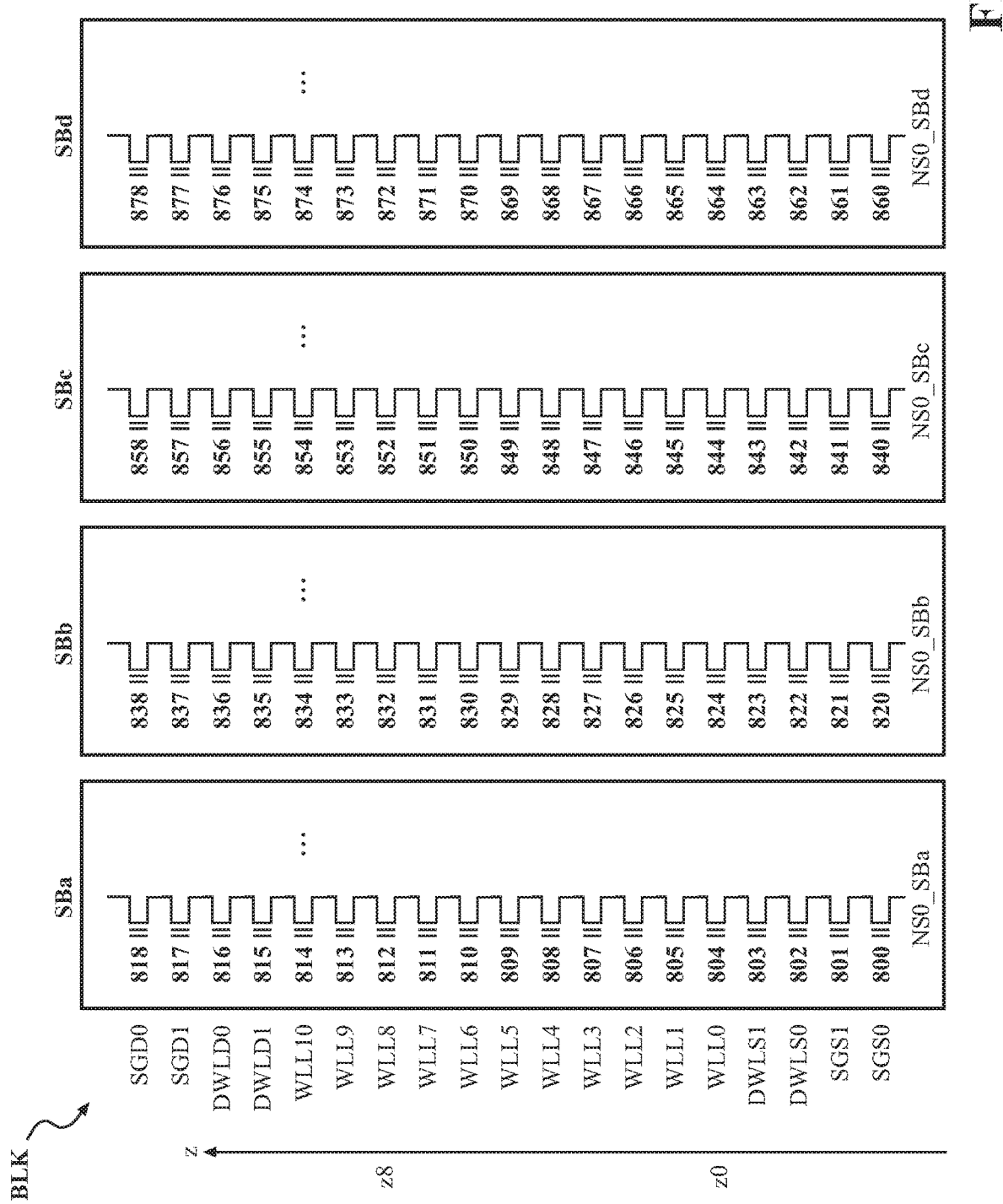
FIG. 8A depicts example NAND strings in the sub-blocks SBa-SBd of FIG. 7A.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

Figure 8B:
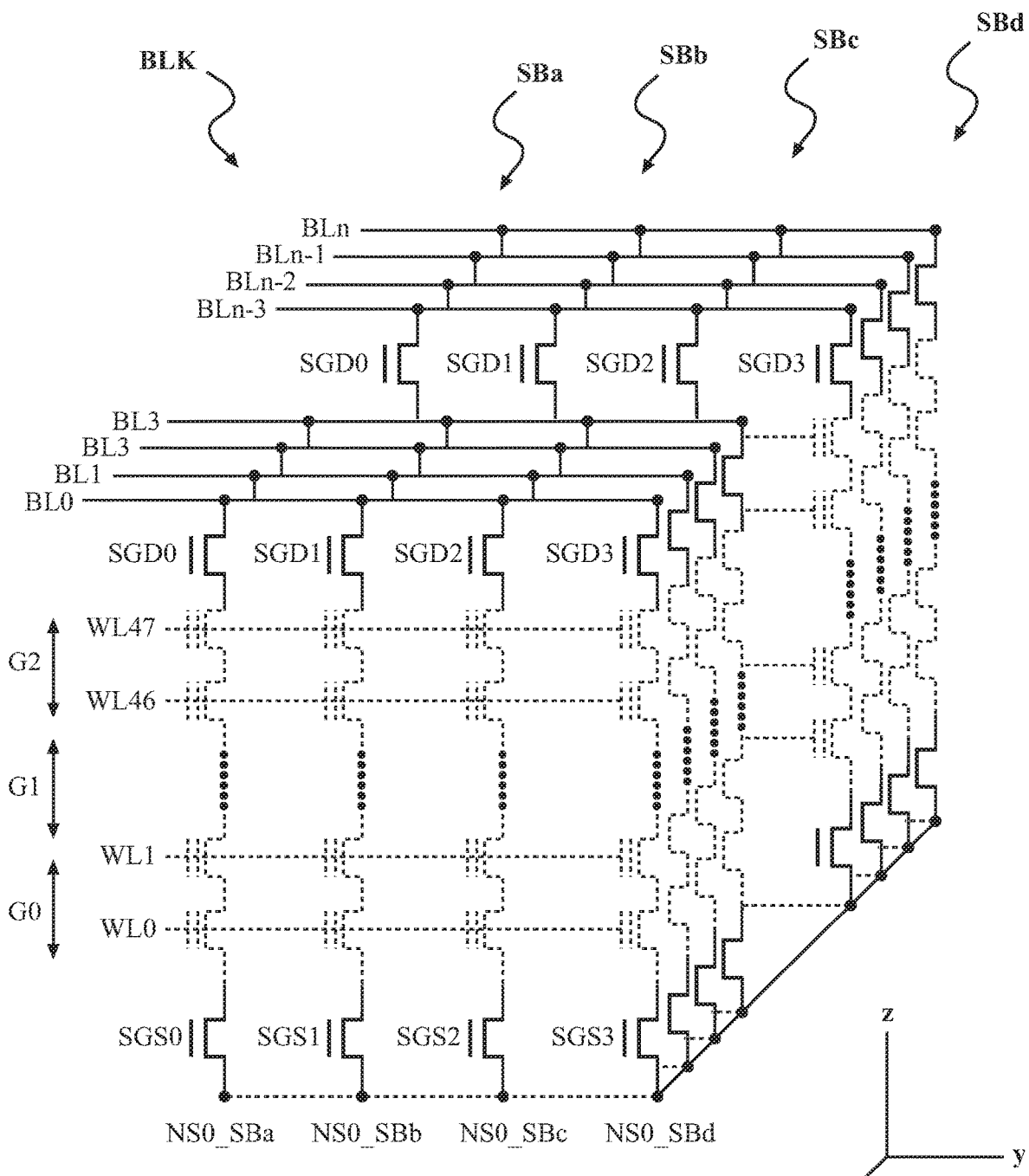
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Particularly in a three-dimensional memory arrangement, the natural Vth distribution can vary for different word lines within a memory block because the layers may have differing memory hole diameters. Thus, it is advantageous to perform a smart verify operation during programming in order to determine the optimal programming voltage for any given word line and avoid either under programming or over programming.

Figure 12:
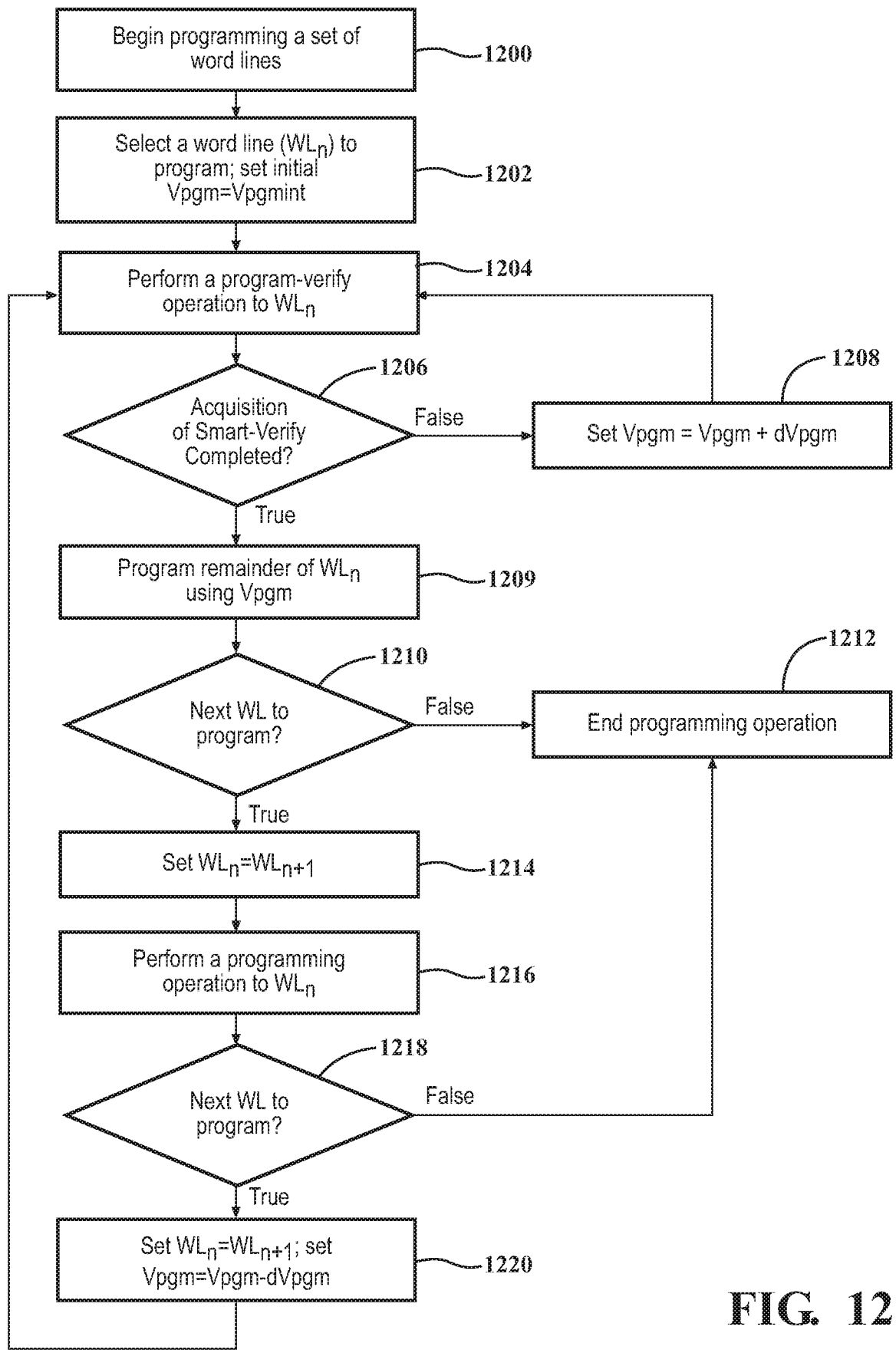
FIG. 12 is a flowchart of an example programming operation in a memory device.

FIG. 12 is a flowchart of an example programming operation in a memory device. Step 1200 begins a programming operation for a set of word lines or for at least one word line. Step 1202 selects a page to program (for example, word line [$WL_n$]) and sets Vpgm to a predetermined initial program voltage (Vpgmint). In one example, Vpgmint is fourteen Volts (14 V).

Step 1204 performs a program-verify iteration which includes applying Vpgm to at least some of the cells coupled to $WL_n$ in a programming operation and applying a verification signal (e.g., a voltage waveform) to $WL_n$ while performing verify tests, e.g., for one or more data states. The cells $WL_n$ which the program-verify iteration is applied to are preferably up to a predetermined checkpoint within $WL_n$. The predetermined checkpoint is preferably near the lowest state threshold voltage.

Decision step 1206 determines if acquisition of smart verify is completed, e.g., based on the results of the verify tests of step 1204. The acquisition may be done, for example, if all or nearly all of the cells of the word line have been programmed to the predetermined checkpoint within WLn. If decision step 1206 is false, then at step 1208, Vpgm is incrementally increased (i.e., stepped up) by a voltage step amount in the form of a predetermined delta program voltage (dVpgm), i.e., Vpgm is set to Vpgm+dVpgm. In one example, dVpgm is one half of a Volt (0.5 V). Next, the programming operation returns to step 1204 to conduct the next program-verify iteration. Each repetition of step 1204 until decision step 1206 is true is one smart-verify loop, which requires resources from the controller.

If decision step 1206 is true (the acquisition of smart verify was completed), then at step 1209, the remaining cells of $WL_n$ are programmed using the newly acquired Vpgm as a starting program voltage and any known program-verify sequence. A decision step 1210 then determines if there is a next word line to program. If decision step 1210 is false (there are no additional word lines to program), then the programming operation ends at step 1212. If decision step 1210 is true, then at step 1214, $WL_n$ is incrementally advanced to the next word line to be programmed, i.e., $WL_n$ is set to $WL_{n+1}$.

Step 1216 performs a programming operation which includes applying Vpgm to $WL_n$. The Vpgm which is applied at step 1216 is the Vpgm which ultimately was successful at step 1206, and thus, Vpgm at step 1216 may be equal to or greater than Vpgmint. Decision step 1218 determines if there is a next word line to program. If decision step 1218 is false (there are no additional word lines to program), then the programming operation ends at step 1212. If decision step 1210 is true, then at step 1220, $WL_n$ is incrementally advanced to the next word line to be programmed ($WL_n$ is set to $WL_{n+1}$) and Vpgm is incrementally decreased (stepped down) by dVpgm (Vpgm is set to Vpgm−dVpgm). The programming operation then returns to the program-verify operation at step 1204. In alternate embodiments, steps 1214, 1216, and 1218 may be repeated one or more times such that two or more wordlines are programmed using Vpgm prior to proceeding back to the program-verify operation of step 1204.

The following table illustrates an example plot showing the programming operation of FIG. 12 as applied to ten exemplary word lines ($WL_1$-$WL_{10}$).

| WL | Start Vpgm | Acquired Vpgm |
|---|---|---|
| 1 | Vpgmint | Vpgm($WL_1$) |
| 2 | Vpgm($WL_1$) | None |
| 3 | Vpgm($WL_1$)-dVpgm | Vpgm($WL_3$) |
| 4 | Vpgm($WL_3$) | None |
| 5 | Vpgm($WL_3$)-dVpgm | Vpgm($WL_5$) |
| 6 | Vpgm($WL_5$) | None |
| 7 | Vpgm($WL_5$)-dVpgm | Vpgm($WL_7$) |
| 8 | Vpgm($WL_7$) | None |
| 9 | Vpgm($WL_7$)-dVpgm | Vpgm($WL_9$) |
| 10 | Vpgm($WL_9$) | None |

In the above example, the cumulative number of smart verify loops which must be completed to successfully program these ten word lines is reduced as compared to other known programming operations which utilize a smart verify operation to minimize under programming and over programming. In other words, the programming operation optimizes the time to acquire the optimal programming voltages. Thus, the overall performance and the endurance of the memory device are both improved.

Figure 13:
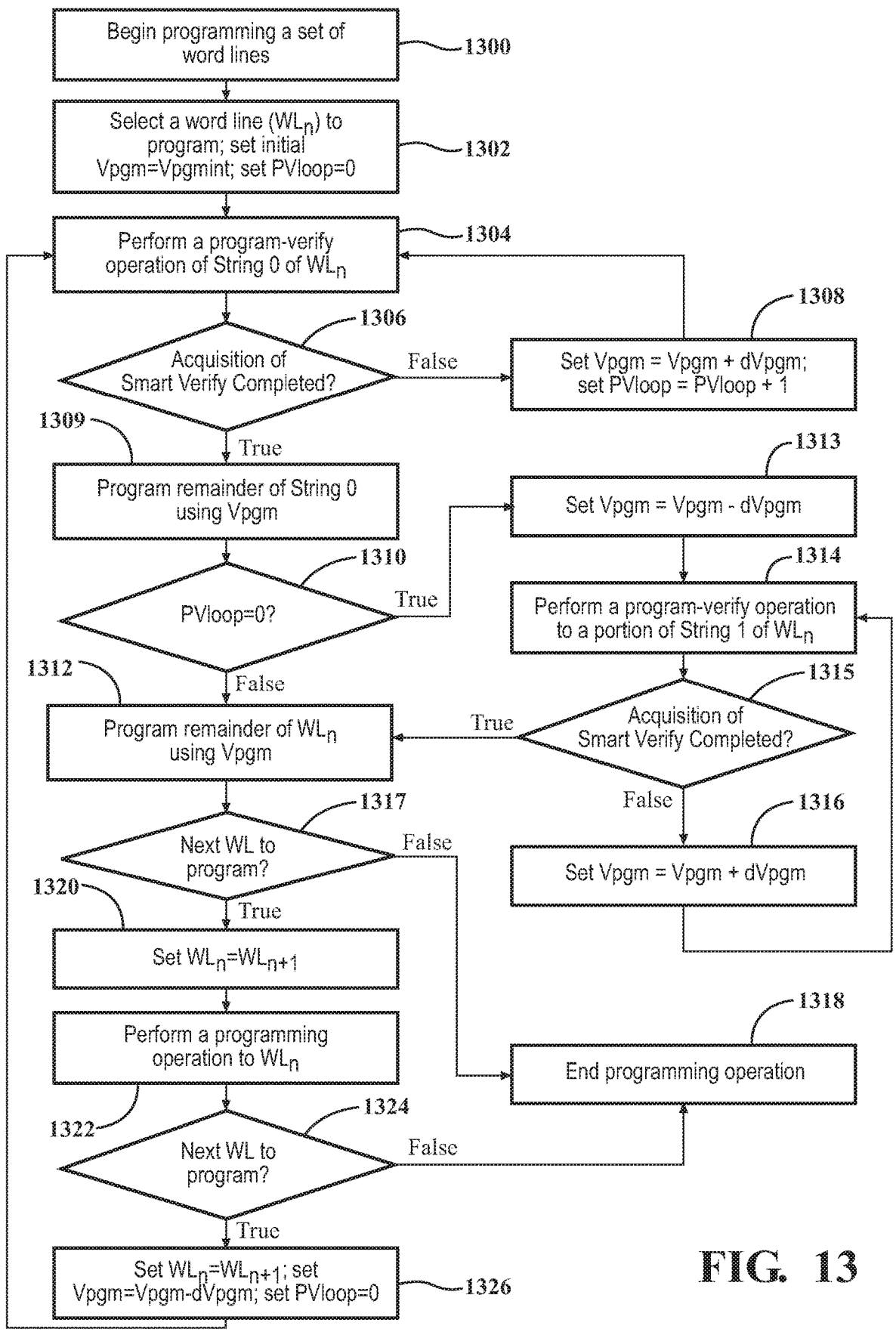
FIG. 13 is a flowchart of an alternate example programming operation in a memory device.

FIG. 13 is a flow chart illustrating an alternate programming operation for the memory device. Step 1300 begins a programming operation for a set of word lines or for at least one word line. Step 1302 selects a page to program (for example, word line [$WL_n$]), sets Vpgm to a predetermined initial voltage (Vpgmint), and sets a program-verify count loop (PVloop) to zero.

Step 1304 performs a program-verify iteration to only a portion of the cells of String 0 coupled to $WL_n$. The program-verify operation includes applying Vpgm to the cells of String 0 coupled to $WL_n$ and applying a verification signal (e.g., a voltage waveform) to those cells while performing verify steps, e.g., for one or more data states. Decision step 1306 determines if the acquisition of smart verify is complete, e.g., based on the results of the verify tests of step 1304. The acquisition may be done, for example, if all or nearly all of the cells have been programmed to the predetermined checkpoint within $WL_n$. If decision step 1306 is false, then at step 1308, Vpgm is incrementally advanced (i.e., stepped up) by dVpgm and PVloop is incremented by one, i.e., Vpgm is set to Vpgm+dVpgm and PVloop is set to PVloop+1. Next, the programming operation returns to step 1304 to perform the next program-verify iteration. This loop continues until step 1306 is true. If decision step 1306 is true, then at step 1309, the remaining cells of String 0 of $WL_n$ are programmed using Vpgm, and the programming operation continues to step 1310.

Decision step 1310 analyzes the PVloop counter to determine if it has remained zero following the acquisition of smart verify for String 0 of $WL_n$. If decision step 1310 is false, then step 1312 performs a programming operation on the cells of the remaining Strings coupled to $WL_n$ (i.e., Strings 1-3) using Vpgm as the programming voltage value.

If decision step 1310 is true (i.e., the acquisition of smart-verify was completed in step 1304 on the first iteration), then at step 1313, Vpgm is incrementally reduced, (i.e., Vpgm is set to Vpgm−dVpgm) before the operation advances to step 1314 to protect the cells of the remaining strings of $WL_n$ from over programming. In alternate embodiments, the dVpgm applied at step 1313 could be different than the dVpgm which is applied at step 1304.

Step 1314 performs a program-verify operation to a portion of String 1 of $WL_n$ using Vpgm. Decision step 1315 determines if the acquisition of smart verify is complete, e.g., based on the results of the verify tests in step 1314. If decision step 1315 is false, then at step 1316, Vpgm is incrementally increased (i.e., Vpgm is set to Vpgm+dVpgm), and the programming operation returns to step 1314. If decision step 1315 is true, then the programming operation continues to step 1312, and the remainder of String 1 and all of Strings 2 and 3 are programmed using Vpgm.

In alternate embodiments, if smart-verify is acquired following the first iteration of the program-verify operation of String 1 during step 1314, then steps 1313-1316 can be repeated for String 2. Likewise, steps 1313-1316 can be repeated for String 3 if smart-verify is acquired following the first iteration of the program-verify operation of String 2 during step 1314.

Following step 1312, a decision step 1317 determines if there is a next word line to program. If decision step 1317 is false (there are no additional word lines to program), then the programming operation ends at step 1318. If decision step 1316 is true, then at step 1320, $WL_n$ is incrementally advanced to the next word line to be program, i.e., $WL_n$ is set to $WL_{n+1}$.

Step 1322 performs a programming operation which includes applying Vpgm to $WL_n$. The Vpgm which is applied at step 1322 is the Vpgm which was applied at step 1312 and may be less than, equal to, or greater than Vpgmint.

Decision step 1324 determines if there is a next word line to program. If decision step 1324 is false (there are no additional word lines to program), then the programming operation ends at step 1318. If decision step 1324 is true, then at step 1326, $WL_n$ is incrementally advanced to the next word line to be programmed ($WL_n$ is set to $WL_{n+1}$), Vpgm is incrementally decreased (stepped down) by dVpgm (Vpgm is set to Vpgm−dVpgm), and PVloop is reset (PVloop is set to 0). The programming operation then returns to the program-verify iteration at step 1304. In alternate embodiments, steps 1320, 1322, and 1324 may be repeated one or more times such that two or more wordlines are programmed using Vpgm prior to proceeding back to the program-verify operation of step 1304.

The following table illustrates an example plot showing the programming operation of FIG. 13 as applied to four exemplary word lines ($WL_1$-$WL_4$). It is possible that different strings may have different programming characteristics. Often, in the case that there is a predetermined offset for the cells in a word line across the multiple strings (see, for example, FIG. 7A), it is likely that these cells will have similar programming characteristics and similar ideal programming voltages.

| WL | Start Vpgm | String 0 | String 1 | String 2 | String 3 |
|---|---|---|---|---|---|
| 1 | Vpgmint | Acquire Vpgm (WL$_1$) | Use Vpgm (WL$_1$) | Use Vpgm (WL$_1$) | Use Vpgm (WL$_1$) |
| 2 | Vpgm(WL$_1$) | Use Vpgm (WL$_1$) | Use Vpgm (WL$_1$) | Use Vpgm (WL$_1$) | Use Vpgm (WL$_1$) |
| 3 | Vpgm(WL$_1$)-dVpgm | Acquire Vpgm (WL$_3$) | Reacquire Vpgm (WL$_3$) | Use Vpgm (WL$_3$) | Use Vpgm (WL$_3$) |
| 4 | Vpgm(WL$_3$) | None | Use Vpgm (WL$_3$) | Use Vpgm (WL$_3$) | Use Vpgm (WL$_3$) |

Figure 14:
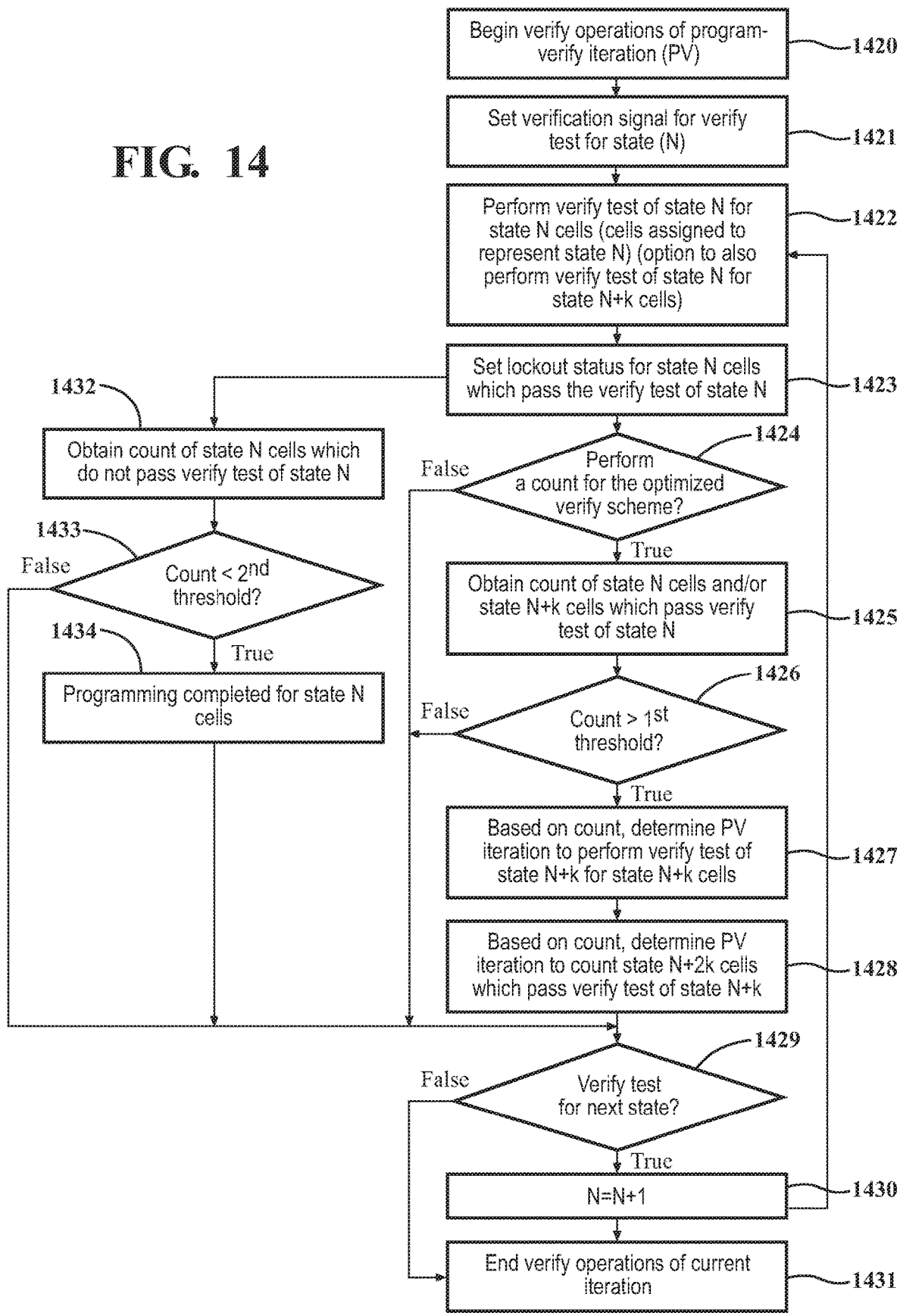
FIG. 14 is a flowchart of an example verify operation.

FIG. 14 is a flowchart of an example verify operation consistent with step 1204 of FIG. 12 and step 1304 of FIG. 13. Step 1420 begins verify operations of a program-verify (PV) iteration. Step 1421 sets a verification signal for a verify test for state (N). For example, this could include applying a verify voltage to the selected word line. Step 1421 performs a verify test of state N for state N cells, e.g., cells assigned to represent state N. There is an option to also perform a verify test of state N for state N+k cells, e.g., cells assigned to represent state N+k. k is an integer, as discussed, such as 1, 2 or 3. For example, at the start of programming, N may be the "1" state in FIG. 15. As a further example, k=2 and N+k=3. Step 1423 sets a lockout status for state N cells which pass the verify test of state N. When k=2 or more, the another data state (N+k state) is at least two data states higher than the one data state (N state). In another possibility, the another data state has a higher verify voltage than the one data state.

Step 1432 obtains a count of state N cells which do not pass the verify test of state N. A decision step 1433 determines if the count is less than a 2nd threshold, e.g., 1-5% of the state N cells. If decision step 1433 is true, the programming is completed for the state N cells at step 1434. A decision step 1429 determines if there is a verify test for a next state. If decision step 1429 is false, step 1431 ends the verify operations of the current iteration. If decision step 1429 is true, N is incremented at step 1430 and step 1422 follows with a verify test.

A decision step 1424 determines whether to perform a count for the optimized verify scheme. At the start of programming, the verify scheme may designate that the count should be obtained starting in a particular PV iteration. Subsequently, the verify scheme may designate that the count should be obtained starting in a particular PV iteration which is determined adaptively, based on the programming progress as described herein. If decision step 1424 is false, decision step 1429 is reached, as discussed previously. If decision step 1424 is true, step 1425 obtains a count of state N cells and/or state N+k cells which pass the verify test of state N. Note that the counting for the optimized verify scheme is concerned with the upper tail of a Vth distribution, so that a count of cells which pass the verify test and are therefore in the upper tail is of interest. In contrast, the counting for the state N cells at step 1432 is concerned with the lower tail of a Vth distribution, so that a count of cells which do not pass the verify test and are therefore in the lower tail is of interest.

A decision step 1426 determines if the count exceeds a first threshold. If decision step 1426 is false, decision step 1429 follows. If decision step 1426 is true, step 1427 determines, based on the count, a particular program-verify iteration to perform a verify test of state N+k for state N+k cells based. This could be a PV iteration in which the verify test of state N+k is first performed for the state N+k cells in the programming operation. An initial number of program-verify iterations may have been performed when step 1426 is true. Optionally, step 1428 determines, based on the count, a PV iteration to count state N+2k cells which pass a verify test of state N+k. This is a program-verify iteration in which to obtain an additional count. The PV iteration determined in step 1427 or 1428 is stored for future use in the program operation as part of the verify scheme.

This is an example of an apparatus in which one set of memory cells comprises memory cells assigned to represent an additional data state among a plurality of data states, and a determination circuit is configured to determine, based on the amount by which the count exceeds the threshold, a program-verify iteration in which to cause the counting circuit to begin obtaining an additional count of memory cells which pass the verify test for the another data state, and to determine, when the additional count exceeds a respective threshold, and based on an amount by which the additional count exceeds the respective threshold, a program-verify iteration in which to perform a verify test for the additional data state for the memory cells assigned to represent the additional data state.

For example, assume the current PV iteration performs a verify test of state 1 for state 1 cells and state 3 cells. Step 1427 determines when to perform a verify test of state 3 for state 3 cells. Step 1428 determines when to perform a verify test of state 3 for state 5 cells. Thus, the current verify tests determine whether cells of one data state have completed programming while also optimizing the verify scheme for higher state cells. Also, step 1422 perform a verify test of state 1 for state 1 cells. Step 1422 can also perform a verify test of state 1 for cells of other states such as state 3 cells. Generally, cells assigned to different states will have similar programming speeds so that their programming progress is similar. Thus, the count of state 1 cells will serve as a good indicator of when to verify the state 3 cells at state 3. However, it is possible that there are program speed variations between the cells assigned to different states. A count of state 3 cells verified at state 1 will therefore serve as a best indicator of when to verify the state 3 cells at state 3.

In some PV iterations, cells assigned to different states will have different programming speeds. For example, cells of one data state may be subject to a slowdown measure when their Vth exceeds a lower verify level but have not reached a lockout level. In this case, for instance, the count of state 1 cells which are subject to a slowdown measure will not serve as a good indicator of when to verify the state 3 cells at state 3. Instead, the count of state 3 cells verified at state 1 will serve as an accurate indicator of when to verify the state 3 cells at state 3.

A further option is to obtain two or more counts, e.g., a first count of state 1 cells verified at state 1 and a second count of state 3 cells verified at state 1. The PV iteration of step 1427 or 1428 can be determined separately for each count. If the results differs, one of the results can be selected. A conservative approach is to select the PV iteration among the multiple results which occurs sooner in the programming operation.

Figure 15:
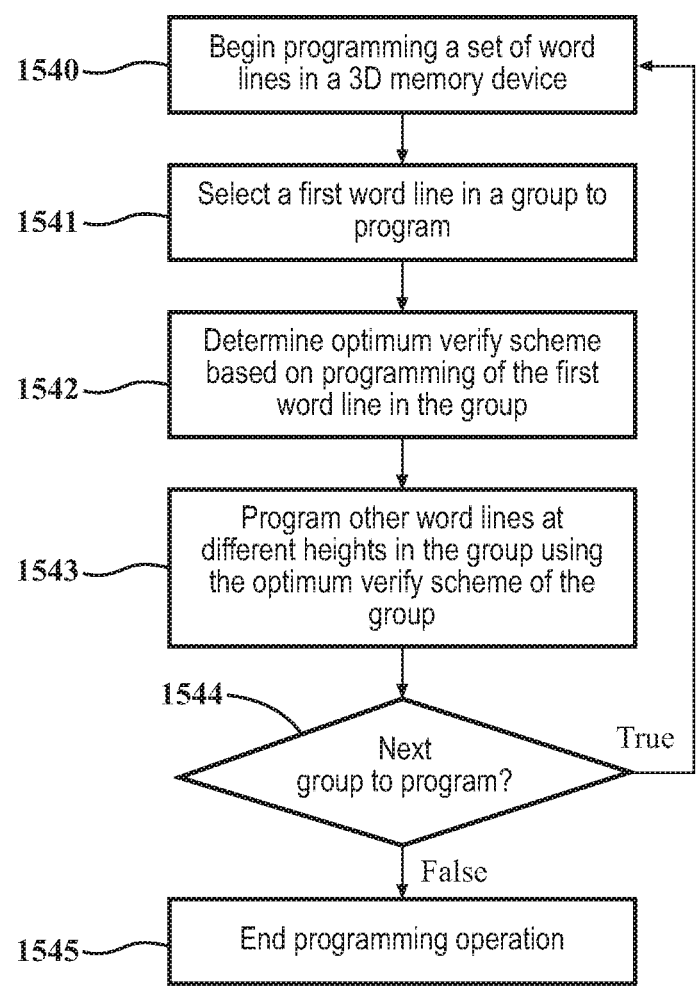
FIG. 15 is a flowchart of an example programming operation which determines an optimum verify scheme for a group of word lines, where the word lines are at different heights in a 3D memory device.

FIG. 15 is a flowchart of an example programming operation which determines an optimum verify scheme for a group of word lines, where the word lines are at different heights in a 3D memory device. Refer also to FIGS. 6C and 8B. Step 1540 begins programming of a set of word lines in a 3D memory device. Step 1541 selects a first word line in a group to program. For example, this could be WLL0 in G0 in FIG. 6C. Step 1542 determines an optimum verify scheme based on programming of the first word line in the group, e.g., in accordance with FIG. 14. Step 1543 programs other word lines, e.g., WLL1 and WLL2 in FIG. 6C, at different heights in the group using the optimum verify scheme of the group. A decision step 1544 determines whether there is a next group to program. If decision step 1544 is true, the process returns to step 1541. If decision step 1544 is false, the programming operation ends at step 1545. For instance, WLL3 may be the first word line in G1, and WLL7 may be the first word line in G2. The optimum verify scheme of WLL3 may be used in programming WLL4 and WLL5. The optimum verify scheme of WLL7 may be used in programming WLL8, WLL9 and WLL10. This approach saves time because the optimum verify scheme is not determined for each word line. The optimum verify scheme for one word line in a group should be optimum for other word lines in a group that are relatively close together and therefore have a similar memory hole diameter and a correspondingly similar program speed. The optimum verify scheme is re-determined when the memory hole diameter changes significantly.

Figure 16:
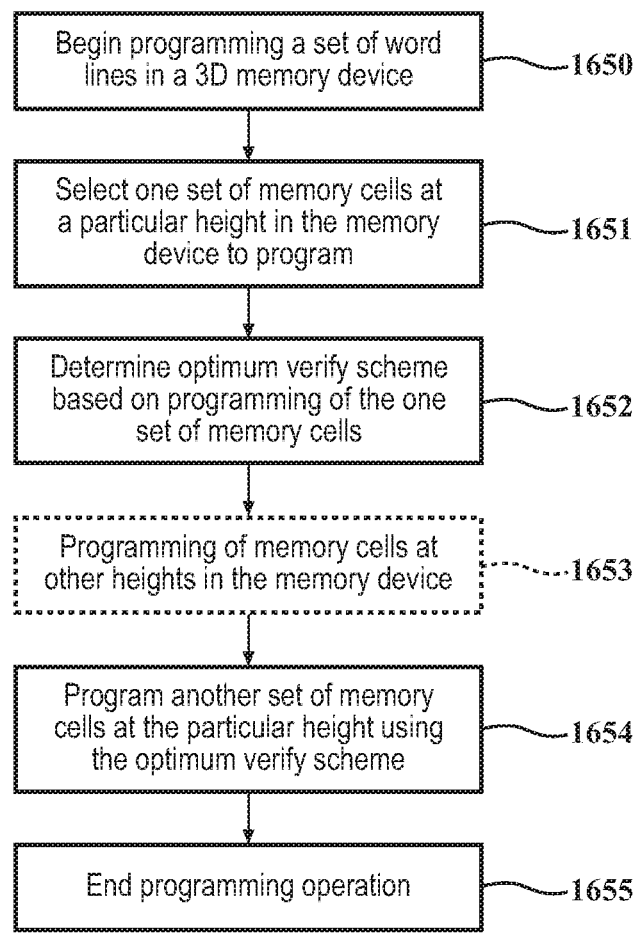
FIG. 16 is a flowchart of an example programming operation which determines an optimum verify scheme for one set of memory cells and applies the optimum verify scheme to another set of memory cells where both sets are at a common height in a 3D memory device.

FIG. 16 is a flowchart of an example programming operation which determines an optimum verify scheme for one set of memory cells and applies the optimum verify scheme to another set of memory cells, where both sets are at a common height in a 3D memory device. This approach is based on the fast that memory cells which are at a common height in a stack will have a similar memory hole diameter and a correspondingly similar program speed. This approach saves time because the optimum verify scheme is not determined for different sets of memory cells connected to a common word line. The different sets of memory cells can be in different sub-blocks, for example.

Step 1650 begins programming of a set of word lines in a 3D memory device. Step 1651 selects one set of memory cells at a particular height in the memory device to program, e.g., memory cells of a particular word line layer. Step 1652 determines an optimum verify scheme based on programming of the one set of memory cells, e.g., in accordance with FIG. 14. Step 1653 includes optional programming of memory cells at other heights or word line layers in the memory device. Step 1654 includes programming another set of memory cells at the particular height using the optimum verify scheme. Step 1655 ends the programming operation, or additional memory cells can be programmed.

FIG. 17 is a flowchart of an example programming operation which determines an optimum verify scheme for one set of memory cells and applies the optimum verify scheme to another set of memory cells, where the sets are at different heights in a 3D memory device. Step 1760 begins programming of a set of word lines in a 3D memory device. Step 1761 selects one set of memory cells at a particular height (e.g., in a particular word line such as WL0) in the memory device to program. Step 1762 determines an optimum verify scheme based on programming of the one set of memory cells. Step 1763 includes, based on the optimum verify scheme for the one set of memory cells and program slopes of the one set of memory cells and another set of memory cells at another particular height (e.g., in another word line such as WL40), determine an optimum verify scheme for the another set of memory cells. The program slopes may be determined from testing, for example. Step 1764 includes programming the another set of memory cells using its optimum verify scheme. Step 1765 ends the programming operation, or other memory cells may be programmed.

As an example, consider the PV iteration determined in step 1427 of FIG. 14 during step 1763 from WL40. Assume, in a 20th V iteration, step 1427 determines that the PV iteration to perform the verify test of state N+k for state N+k cells is the 22nd PV iteration. At this point, 20 program pulses of magnitude (step size) 0.2 V, for instance have been applied. For WL0, at the 22nd PV iteration, the Vth of the cells is expected to be 22×0.2×0.83=3.65 V, assuming a starting Vth of 0 V. For WL40, the Vth of the cells is expected to reach 3.65 V at 3.65/(0.2×0.75)=24 PV iterations. The verify scheme of WL40 can therefore be set to perform the verify test of state N+k for state N+k cells at the 24th PV iteration. The adjustment is therefore based on step size and program slope.

This is an example of an apparatus in which a determination circuit is configured to determine, based on the count and a difference between a program slope of the one set of memory cells and a program slope of the another set of memory cells, a particular program-verify iteration in which to perform the verify test for memory cells in the another set of memory cells which are assigned to represent the another data state (N+k state).

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A storage device, comprising:
a non-volatile memory coupled to a controller;
the non-volatile memory including control circuits and including a memory array;
the memory array including a plurality of word lines;
wherein the controller is configured to:
determine a first programming voltage by performing at least one program-verify iteration on at least a portion of a first word line of the plurality of word lines using a voltage value which starts as a predetermined first initial voltage and is sequentially increased by a first voltage step amount following each failure to successfully program until the programming is completed,
determine a second initial programming voltage by decreasing the first programming voltage by a second voltage step amount; and
perform at least one program-verify iteration on at least a portion of a second word line of the plurality of word lines using a voltage value which starts as the second initial programming voltage and is increased by the first voltage step amount following each sequential failure to successfully program until the programming is completed.

2. The storage device as set forth in claim 1, wherein the controller is further configured to:
determine a second programming voltage which is the voltage value that successfully programs the second word line;
determine a third initial programming voltage by decreasing the second programming voltage by the second voltage step amount; and perform at least one program-verify iteration on at least a portion of a third word line using a voltage value which starts as the third initial programming voltage and is increased by the first voltage step amount following each sequential failure to successfully program until the programming is completed.

3. The storage device as set forth in claim 1 wherein the controller is further configured to:
program another word line at the first programming voltage in between performing the at least one program-verify iteration on the first word line and performing the at least one program-verify iteration on the second word line.

4. The storage device as set forth in claim 1 wherein the first voltage step amount is equal to the second voltage step amount.

5. The storage device as set forth in claim 1 wherein the controller is further configured to:
program another portion of the first word line using a voltage value that is less than the first programming voltage in response to the first programming voltage being equal to the predetermined first initial voltage.

6. The storage device as set forth in claim 5 wherein the controller is further configured to:
program another portion of the second word line using a voltage value that is less than the second initial programming voltage in response to the second programming voltage being equal to the second initial programming voltage.

7. A method of reducing a time to perform smart verify in a storage device that includes a controller and a memory array, comprising the steps of:
performing at least one program-verify iteration on at least a portion of a first word line of the memory array using a voltage value which starts as a predetermined initial value and is sequentially increased by a first voltage step amount following each failure to successfully program until the programming is completed to determine a first programming voltage;
determining a second initial programming voltage by decreasing the first programming voltage by a second voltage step amount; and
performing at least one program-verify iteration on at least a portion of a second word line of the memory array using a voltage value which starts as the second initial programming voltage and is increased by the first voltage step amount following each sequential failure to successfully program until the programming is completed.

8. The method as set forth in claim 7, further comprising the steps of:
determining a second programming voltage being the voltage value that successfully programs the second word line;
determining a third initial programming voltage by decreasing the second programming voltage by the second voltage step amount; and
performing at least one program-verify iteration on at least a portion of a third word line using a voltage value which starts as the third initial programming voltage and is increased by the first voltage step amount following each sequential failure to successfully program until the programming is complete.

9. The method as set forth in claim 7 further including the step of programming another word line at the first programming voltage in between performing the at least one program-verify iteration on the first word line and performing the at least one program-verify iteration on the second word line.

10. The method as set forth in claim 7 wherein the first voltage step amount is equal to the second voltage step amount.

11. The method as set forth in claim 7 further including the step of programming another portion of the first word line using a voltage value that is less than the first programming voltage in response to the first programming voltage being equal to the predetermined first initial voltage.

12. The method as set forth in claim 11 further including the step of programming another portion of the second word line using a voltage value that is less than the second initial programming voltage in response to the second programming voltage being equal to the second initial programming voltage.

13. The method as set forth in claim 7 wherein the step of performing at least one program-verify iteration on at least a portion of the first word line of the memory array using a voltage value which starts as a predetermined initial value and is sequentially increased by a first voltage step amount following each failure to successfully program until the programming is completed to determine a first programming voltage is further defined as performing at least one program-verify iteration on the entire first word line of the memory array using a voltage value which starts as a predetermined initial value and is sequentially increased by a first voltage step amount following each failure to successfully program until the programming is completed to determine a first programming voltage.

14. The method as set forth in claim 13 wherein the step of performing at least one program-verify iteration on at least a portion of the second word line of the memory array using a voltage value which starts as the second initial programming voltage and is increased by the first voltage step amount following each sequential failure to successfully program until the programming is completed is further defined as performing at least one program-verify iteration on the entire second word line of the memory array using a voltage value which starts as the second initial programming voltage and is increased by the first voltage step amount following each sequential failure to successfully program until the programming is completed.

15. An apparatus, comprising:
a plurality of memory cells arranged in a plurality of pages;
a control circuit coupled to the plurality of memory cells and configured to:
acquire a first programming voltage by performing at least one program-verify iteration on at least a portion of a first page until the at least a portion of the first page is programmed;
program at least a portion of a second page using the first programming voltage; and
perform at least one program-verify iteration on at least a portion of a third page and wherein the at least one program-verify iteration starts with a voltage value which is less than the first programming voltage until the at least a portion of the third page is programmed.

16. The apparatus as set forth in claim 15 wherein the control circuit is further configured to acquire a second programming voltage which is the voltage value that successfully programs the at least a portion of the third page.

17. The apparatus as set forth in claim 16 wherein the control circuit is further configured to program a fourth page using the second programming voltage.

18. The apparatus as set forth in claim 15 wherein the control circuit is configured to increase a voltage value being applied to the first page by a voltage step amount in between program-verify iterations.

19. The apparatus as set forth in claim 18 wherein the control circuit is configured such that the at least one program-verify iteration of the at least a portion of the third page is determined by reducing the first programming voltage by the voltage step amount.

20. The apparatus as set forth in claim 15 wherein the control circuit is configured to program another portion of the third page using a voltage value which is less than the first programming voltage in response to the at least a portion of the third page being programmed at a voltage value that is less than the first programming voltage.

* * * * *